(12) United States Patent
Jun et al.

(10) Patent No.: US 11,688,707 B2
(45) Date of Patent: Jun. 27, 2023

(54) SEMICONDUCTOR PACKAGE

(71) Applicant: Samsung Electronics Co., Ltd., Suwon-si (KR)

(72) Inventors: Joonho Jun, Cheonan-si (KR); Sangsick Park, Hwaseong-si (KR); Unbyoung Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 17/307,672

(22) Filed: May 4, 2021

(65) Prior Publication Data
US 2022/0020713 A1 Jan. 20, 2022

(30) Foreign Application Priority Data
Jul. 20, 2020 (KR) .................. 10-2020-0089860

(51) Int. Cl.
*H01L 25/065* (2023.01)
*H01L 23/00* (2006.01)

(52) U.S. Cl.
CPC .............. *H01L 24/13* (2013.01); *H01L 24/05* (2013.01); *H01L 24/16* (2013.01); *H01L 25/0657* (2013.01); *H01L 2224/0401* (2013.01); *H01L 2224/05017* (2013.01); *H01L 2224/05147* (2013.01); *H01L 2224/05155* (2013.01); *H01L 2224/05551* (2013.01); *H01L 2224/05644* (2013.01); *H01L 2224/13021* (2013.01); *H01L 2224/16146* (2013.01); *H01L 2224/16147* (2013.01); *H01L 2224/16148* (2013.01); *H01L 2225/06513* (2013.01)

(58) Field of Classification Search
CPC ...................................................... H01L 24/13
See application file for complete search history.

(56) References Cited

U.S. PATENT DOCUMENTS

| | | | |
|---|---|---|---|
| 7,446,419 B1 | 11/2008 | Lin et al. | |
| 8,129,841 B2 | 3/2012 | Pendse et al. | |
| 8,669,137 B2 | 3/2014 | Nah et al. | |
| 9,281,286 B1 | 3/2016 | Yap et al. | |
| 9,431,325 B2 | 8/2016 | Lin et al. | |
| 2008/0023830 A1* | 1/2008 | Chang | H01L 24/13 257/737 |
| 2011/0101523 A1 | 5/2011 | Hwang et al. | |
| 2011/0177686 A1* | 7/2011 | Zeng | B23K 35/286 257/E21.509 |
| 2012/0145442 A1* | 6/2012 | Gupta | H01L 23/528 174/267 |
| 2012/0252168 A1* | 10/2012 | Nah | H01L 21/4853 257/E21.502 |
| 2018/0132352 A1 | 5/2018 | Yanagihashi et al. | |
| 2019/0393134 A1 | 12/2019 | Jin et al. | |

* cited by examiner

*Primary Examiner* — William A Harriston
(74) *Attorney, Agent, or Firm* — Muir Patent Law, PLLC

(57) ABSTRACT

Provided is a semiconductor package including: a first substrate having a first electrode pad and a first protective layer in which a cavity is formed; a first bump pad arranged in the cavity and connected to the first electrode pad; a second substrate facing the first substrate and having a second bump pad; and a bump structure in contact with the first bump pad and the second bump pad, wherein the first electrode pad has a trapezoidal shape, and the first bump pad has a flat upper surface and an inclined side surface extending along a side surface of the first electrode pad.

18 Claims, 11 Drawing Sheets

SEMICONDUCTOR PACKAGE

CROSS-REFERENCE TO RELATED APPLICATION

This application is based on and claims priority under 35 U.S.C. § 119 to Korean Patent Application No. 10-2020-0089860, filed on Jul. 20, 2020, in the Korean Intellectual Property Office, the disclosure of which is incorporated by reference herein in its entirety.

BACKGROUND

The inventive concept relates to a semiconductor package, and more particularly, to a semiconductor package including a bump structure.

According to the rapid development of the electronics industry and the demands of users, electronic devices are becoming more compact and multifunctional. Accordingly, the need for miniaturization and multi-functionalization of semiconductor chips used in electronic devices has also increased. A semiconductor chip having a fine-pitch connection terminal is required, and a fine-sized connection terminal, for example, a bump structure, is required to mount a high-capacity semiconductor chip in a structure of a limited semiconductor package. In addition, spacing between bump structures included in the semiconductor package has been continuously decreased.

SUMMARY

The inventive concept provides a semiconductor package including a bump pad having an inclined side surface under a bump structure to improve electrical characteristics and reliability.

The inventive concept is not limited to the above objectives, but other objectives not described herein may be clearly understood by one of ordinary skill in the art from descriptions below.

According to an aspect of the inventive concept, there is provided a semiconductor package including: a first substrate having a first electrode pad and a first protective layer in which a cavity is formed; a first bump pad arranged in the cavity and connected to the first electrode pad; a second substrate facing the first substrate and having a second bump pad; and a bump structure in contact with the first bump pad and the second bump pad, wherein the first electrode pad has a trapezoidal shape, and wherein the first bump pad has a flat upper portion and an inclined side portion extending along a side surface of the first electrode pad.

According to another aspect of the inventive concept, there is provided a semiconductor package including: a first substrate having a first surface, a first through electrode protruding to the first surface, and a first protective layer having a cavity formed in the first surface; a first bump pad arranged in the cavity and connected to the first through electrode; a second substrate having a second surface facing the first surface and including a second through electrode protruding toward the second surface; a second bump pad arranged on the second surface and connected to the second through electrode; and a bump structure in contact with the first bump pad and the second bump pad, wherein the first bump pad has an upper portion and an inclined side portion extending from the upper portion, and an angle formed by the upper portion and the inclined side portion is greater than about 90° and less than about 180°.

According to another aspect of the inventive concept, there is provided a semiconductor package including: a first substrate having a redistribution layer formed on an inactive surface, a first trapezoidal electrode pad connected to the redistribution layer, and a first protective layer having a cavity; a first bump pad arranged in the cavity and covering both upper and side surfaces of the first trapezoidal electrode pad; a second substrate having a second bump pad on an active surface; and a bump structure in contact with the first bump pad and the second bump pad, wherein the first bump pad has a flat upper trapezoidal and an inclined side trapezoidal extending along a side surface of the first trapezoidal electrode pad, and an angle formed by the upper trapezoidal and the inclined side trapezoidal is greater than about 90° and less than about 180°.

BRIEF DESCRIPTION OF THE DRAWINGS

Embodiments of the inventive concept will be more clearly understood from the following detailed description taken in conjunction with the accompanying drawings in which like numbers refer to like elements throughout. In the drawings.

DETAILED DESCRIPTION OF THE EMBODIMENTS

Hereinafter, example embodiments of the inventive concept will be described in detail with reference to the accompanying drawings.

Figure 1:
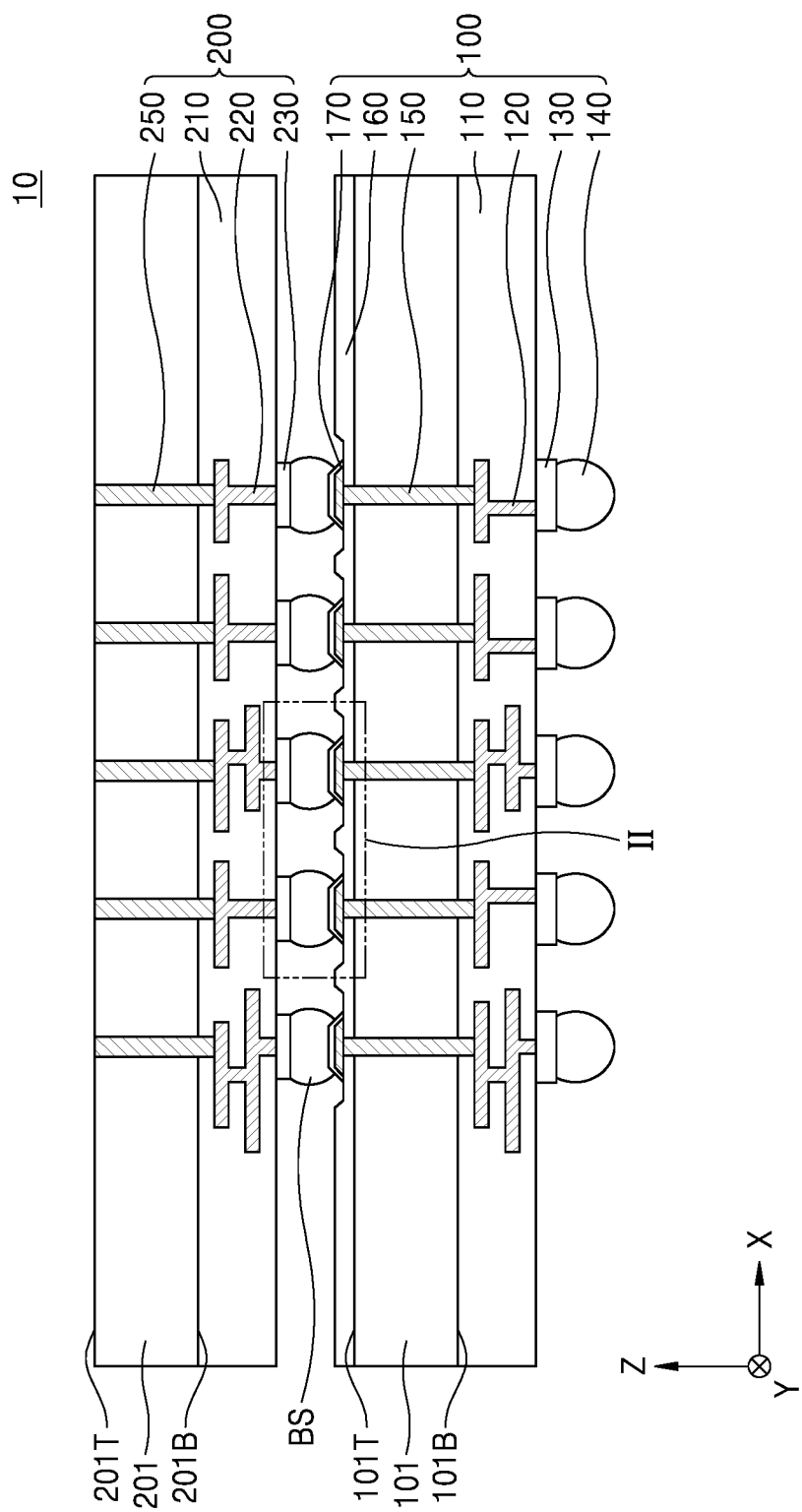
FIG. 1 is a cross-sectional view of main components of a semiconductor package, according to an example embodiment of the inventive concept.
Figure 2:
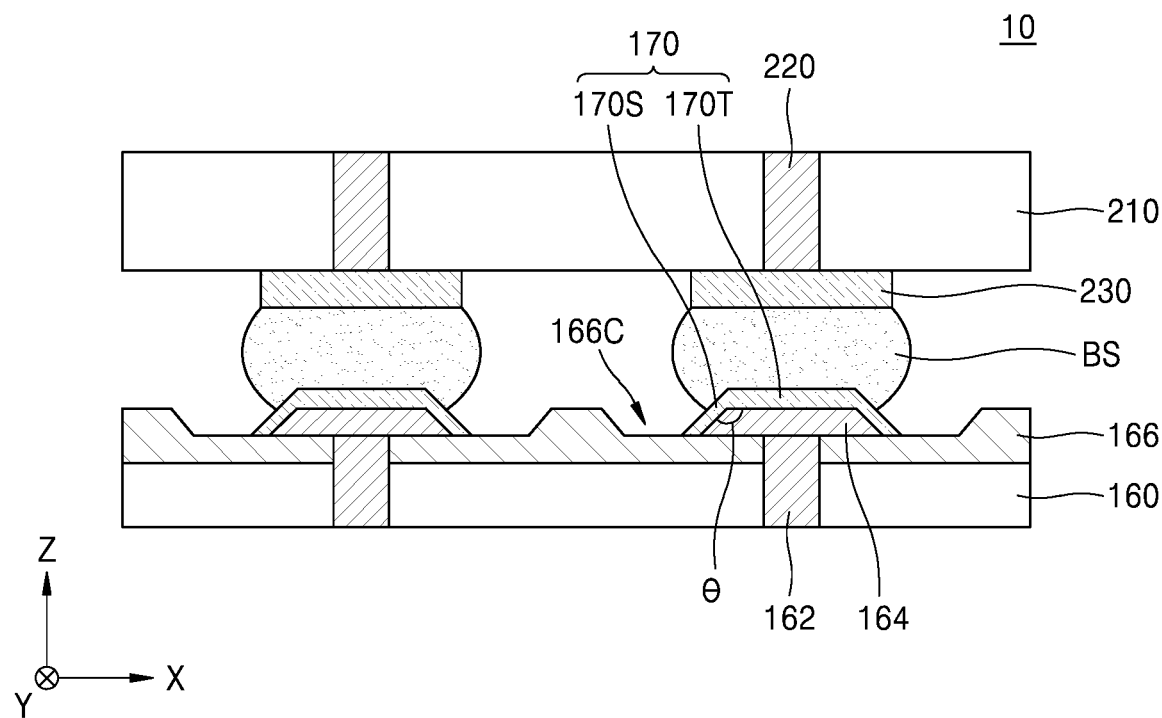
FIG. 2 is an enlarged cross-sectional view of portion II of FIG. 1.

FIG. 1 is a cross-sectional view of main components of a semiconductor package, according to an example embodiment of the inventive concept, and FIG. 2 is an enlarged cross-sectional view of portion II of FIG. 1.

Referring to FIGS. 1 and 2 together, a semiconductor package 10 includes a first substrate 101 having a first electrode pad 164, a first protective layer 166, and a first bump pad 170. The semiconductor package 10 further includes a second substrate 201 having a second bump pad 230, and a bump structure BS connecting the first substrate 101 to the second substrate 201.

Each of first and second semiconductor chips 100 and 200 included in the semiconductor package 10 according to the present embodiment may be a logic chip or a memory chip. For example, the first and second semiconductor chips 100 and 200 may all be the same type of memory chip. Alternatively, one of the first and second semiconductor chips 100 and 200 may be a memory chip, and the other may be a logic chip.

The memory chip may be, for example, a volatile memory chip such as dynamic random access memory (DRAM) or static random access memory (static RAM), or a nonvolatile memory chip such as phase-change random access memory (PRAM), magnetoresistive random access memory (MRAM), ferroelectric random access memory (FeRAM) or resistive random access memory (RRAM). Further, the logic chip may be, for example, a microprocessor, an analog device, or a digital signal processor.

The first semiconductor chip 100 may include the first substrate 101, a first semiconductor device layer 110, a first wiring layer 120, a first connection pad 130, a first connection terminal 140, a first through electrode 150, a first redistribution layer 160, and the first bump pad 170.

The first substrate 101 is a semiconductor substrate and may have an upper surface 101T and a lower surface 101B facing each other. The upper surface 101T may be referred to as a first surface or an inactive surface, and the lower surface 101B may be referred to as an active surface. The first substrate 101 may include the first semiconductor device layer 110 formed on the lower surface 101B side and the first through electrode 150 penetrating the first substrate 101. The inactive surface may be the surface which does not include any devices, and the active surface may be the surface on which devices are formed.

The first substrate 101 may be, for example, a silicon (Si) wafer including crystalline silicon, polycrystalline silicon, or amorphous silicon. Alternatively, the first substrate 101 may include a semiconductor element such as germanium (Ge), or a compound semiconductor such as silicon carbide (SiC), gallium arsenide (GaAs), indium arsenide (InAs), and indium phosphide (InP). The first substrate 101 may have a silicon on insulator (SOI) structure. For example, the first substrate 101 may include a buried oxide (BOX) layer. In some embodiments, the first substrate 101 may include a conductive area, for example, a well or a structure doped with an impurity. Furthermore, the first substrate 101 may include various element isolation structures such as a shallow trench isolation (STI) structure.

The first semiconductor device layer 110 may include the first wiring layer 120 for connecting a plurality of semiconductor devices to other wires formed in the first substrate 101. The first wiring layer 120 may include a metal wiring layer and a via plug. For example, the first wiring layer 120 may have a multilayer structure in which two or more metal wiring layers or two or more via plugs are alternately stacked.

The first connection pad 130 may be arranged under the first semiconductor device layer 110 and may be electrically connected to the first wiring layer 120 inside the first semiconductor device layer 110. The first connection pad 130 may be electrically connected to the first through electrode 150 through the first wiring layer 120. The first connection pad 130 may include at least one of aluminum (Al), copper (Cu), nickel (Ni), tungsten (W), platinum (Pt), and gold (Au), but is not limited thereto.

The first connection terminal 140 may be arranged to directly contact the first connection pad 130. The first connection terminal 140 may electrically connect the semiconductor package 10 to an external base substrate (not shown). The first semiconductor chip 100 may receive at least one of a control signal, a power signal, and a ground signal for the operation of the first semiconductor chip 100 through the first connection terminal 140, may receive a data signal to be stored in the first semiconductor chip 100, or may provide data stored in the first semiconductor chip 100 to the outside. For example, the first connection terminal 140 may have a pillar structure, a ball structure, or a solder layer.

The first through electrode 150 penetrates the first substrate 101 and may extend from the upper surface 101T to the lower surface 101B of the first substrate 101, and may be connected to the first wiring layer 120 provided in the first semiconductor device layer 110. The first through electrode 150 may extend through a portion of the first semiconductor device layer 110. The first connection pad 130 may be electrically connected to the first through electrode 150 through the first wiring layer 120. At least a portion of the first through electrode 150 may have a column shape. In some embodiments, the first through electrode 150 may be a through silicon via (TSV).

The first redistribution layer 160 may be formed on the upper surface 101T of the first substrate 101 and may be electrically connected to the first through electrode 150. A bottom surface of the first redistribution layer 160 may contact the upper surface 101T of the first substrate 101. The first redistribution layer 160 may be formed as a single layer or a multilayer metal layer. For example, the first redistribution layer 160 may include copper (Cu), nickel (Ni), gold (Au), chromium (Cr), titanium (Ti), or palladium (Pd), or an alloy thereof. The first redistribution layer 160 may be formed through an electroplating process. A redistribution line 162 may be formed to extend through the first redistribution layer 160. The first redistribution layer 160 may surround a side surface of a portion of the redistribution line 162, and may contact the side surface of the portion of the redistribution line 162. The term "contact," as used herein, refers to a direction connection (i.e., touching) unless the context indicates otherwise. The redistribution line 162 may include a metal wiring layer and a via plug. A first electrode pad 164 may be formed above the first redistribution layer 160 and the redistribution line 162. A bottom surface of the first electrode pad 164 may contact an upper surface of the redistribution line 162, and may have a trapezoidal shape. For example, a lower horizontal width (in the X direction) of the first electrode pad 164 may be greater than an upper horizontal width (in the X direction) of the first electrode pad 164. The first electrode pad 164 may be on the top of the first redistribution layer 160. Details of the first electrode pad 164 will be described later below.

The first protective layer 166 may be formed on the first redistribution layer 160, and may contact an upper surface of the first redistribution layer 160. The first protective layer 166 may have a cavity 166C having a certain depth. The cavity 166C may have a bottom surface that is substantially planar and parallel to the upper surface of the first substrate 101. The upper surface of the redistribution line 162 may be coplanar with the bottom surface of the cavity 166C. The first protective layer 166 may surround a side surface of an upper portion of the redistribution line 162, and may contact the side surface of the upper portion of the redistribution line 162. The first protective layer 166 may be formed as a single layer or a multilayer insulating layer to insulate the redistribution line 162. In addition, the first protective layer 166 may be formed to open the first electrode pad 164 and to contact a lower surface of the first electrode pad 164. For example, the first protective layer 166 may include a polymer, benzocyclobutene, or resin, and in particular, may include a photosensitive polyimide. However, the material constituting the first protective layer 166 is not limited thereto. For example, the first protective layer 166 may include silicon-based silicon oxide or silicon nitride.

The first bump pad 170 may be arranged on the upper surface 101T of the first substrate 101 to directly contact the first electrode pad 164. The first electrode pad 164 and the first bump pad 170 may include different materials. For example, the first electrode pad 164 may include copper (Cu), and the first bump pad 170 may include nickel (Ni). However, the materials constituting the first electrode pad 164 and the first bump pad 170 are not limited thereto.

The first bump pad 170 may be arranged in the cavity 166C of the first protective layer 166. In some embodiments, one first bump pad 170 may be arranged within one cavity 166C.

The first bump pad 170 may have a flat upper portion 170T and an inclined side portion 170S extending from the flat upper portion 170T. The flat upper portion 170T and the inclined side portion 170S may be in material continuity. For example, the flat upper portion 170T and the inclined side portion 170S may be formed at the same time and of the same material, without a break in the continuity of the material of which they are formed. The first electrode pad 164 has a trapezoidal shape, and the first bump pad 170 may include the inclined side portion 170S arranged along a side surface of the first electrode pad 164 to conformally surround the first electrode pad 164. An angle θ formed by a point where the flat upper portion 170T and the inclined side portion 170S meet on the first bump pad 170 may be greater than about 90° and less than about 180°. For example, a surface of the flat upper portion 170T may form an interior angle θ with a surface of the inclined side portion 170S, and the interior angle θ may be greater than about 90° and less than about 180°. That is, the first bump pad 170 may not have a flat shape, but may be formed such that the inclined side portion 170S is bent from the flat upper portion 170T. However, the angle θ formed by the inclined side portion 170S and the top upper portion 170T may not be formed to be a right angle.

In some embodiments, a lowermost end of the first bump pad 170 may be formed to contact a lower surface of the cavity 166C. Further, the lowermost end of the first bump pad 170 may be formed to be at the same level as the lower surface of the first electrode pad 164. Further, the level of an uppermost end of the first bump pad 170 may be formed to be greater than the level of an upper surface of the cavity 166C. The upper surface of the flat upper portion 170T of the first bump pad 170 may be at a higher level than an upper surface of the first protective layer 166.

As such, because the first bump pad 170 is formed in a curved shape in the cavity 166C of the first protective layer 166 along the shape of the first electrode pad 164, a contact area between the first bump pad 170 and the bump structure BS may be increased. A detailed description thereof will be provided later below.

The second semiconductor chip 200 may be arranged such that a lower surface 201B of the second substrate 201 constituting the second semiconductor chip 200 faces the upper surface 101T of the first substrate 101 of the first semiconductor chip 100. The second semiconductor chip 200 may be electrically connected to the first semiconductor chip 100 through the bump structure BS interposed between the first semiconductor chip 100 and the second semiconductor chip 200.

Although not shown, an adhesive film is interposed between the upper surface 101T of the first substrate 101 and the lower surface 201B of the second substrate 201 so that the second semiconductor chip 200 may be attached to the first semiconductor chip 100. The adhesive film may be arranged to directly contact the first semiconductor chip 100 and the second semiconductor chip 200 and surround the bump structure BS. The adhesive film may be a die attach film. The die attach film may be classified into an inorganic adhesive and a polymer adhesive.

The second semiconductor chip 200 may include the second substrate 201, a second semiconductor device layer 210, a second wiring layer 220, the second bump pad 230, and a second through electrode 250. Because the second semiconductor chip 200 may have the same or similar characteristics to the first semiconductor chip 100, for convenience of description, the difference from the first semiconductor chip 100 will be mainly described.

The second substrate 201 is a semiconductor substrate and may have an upper surface 201T and the lower surface 201B facing each other. The lower surface 201B may be referred to as a second surface or an active surface, and the upper surface 201T may be referred to as an inactive surface.

The second semiconductor device layer 210 may be formed under the lower surface 201B of the second substrate 201. The second bump pad 230 may contact a lower surface of the second semiconductor device layer 210. The second bump pad 230 may be on the second semiconductor device layer 210 and may be electrically connected to the second wiring layer 220 inside the second semiconductor device layer 210. The second bump pad 230 may be electrically connected to the second through electrode 250 through the second wiring layer 220. The second bump pad 230 may include substantially the same material as that of the first bump pad 170.

The bump structure BS may be arranged to contact the first bump pad 170 and the second bump pad 230, respectively, and to be electrically connected to each other. Through the bump structure BS, the second semiconductor chip 200 may receive at least one of a control signal, a power signal, and a ground signal for the operation of the second semiconductor chip 200 from the outside, may receive a data signal to be stored in the second semiconductor chip 200 from the outside, or may provide data stored in the second semiconductor chip 200 to the outside. For example, the bump structure BS may have a pillar structure, a ball structure, or a solder layer.

In more detail, an upper surface of the bump structure BS is flat along the second bump pad 230, a side surface of the bump structure BS is convex outward, and a lower surface of the bump structure BS may be formed such that at least a portion thereof is inclined along the first bump pad 170. In some embodiments, a lower surface of the bump structure BS may be formed to cover the entire flat upper portion 170T of the first bump pad 170 and at least a part of the inclined side portion 170S. For example, a first area in which the bump structure BS contacts the first bump pad 170 may be greater than a second area in which the bump structure BS contacts the second bump pad 230.

In recent years, in a semiconductor package used in an electronic device, high performance and large capacity are required along with miniaturization and weight reduction. In order to realize high performance and large capacity along with miniaturization and weight reduction, research and development of semiconductor chips including through electrodes and a semiconductor package in which the semiconductor chips are stacked are continuously being conducted.

In order to reduce the size and weight of a semiconductor package in which semiconductor chips are stacked, structurally, the thickness of semiconductor chips is decreasing. Accordingly, for uniform adhesion of semiconductor chips, bonding of microscopic bump structures, solder wettability, electrical reliability, and structural reliability in the stacking process of semiconductor chips, the spacing between bump structures included in a semiconductor package is also continuously decreasing.

During a manufacturing process of a typical semiconductor package, in a process of pressing upper and lower semiconductor chips facing each other with a bump structure therebetween, when the amount of the bump structure protruding to the periphery of a bump pad is excessive, protruding portions of adjacent bump structures are bonded to each other, and a short may occur. This may cause degradation of the quality of the semiconductor package.

To solve this problem, the semiconductor package 10 according to the inventive concept, by arranging the first bump pad 170 having the inclined side portion 170S under the bump structure BS, may guide a protruding portion of the bump structure BS in a downward direction (Z direction) rather than in a side direction (X direction), that is, a direction of the first substrate 101, even under compression conditions such as overpressing and/or misalignment between the first and second substrates 101 and 201.

In this way, because the semiconductor package 10 according to the inventive concept may prevent a phenomenon in which protruding portions of neighboring bump structures BS are bonded to each other in advance, defects such as shorts may be suppressed as much as possible. Ultimately, electrical characteristics and reliability of the semiconductor package 10 may be improved.

Figure 3:
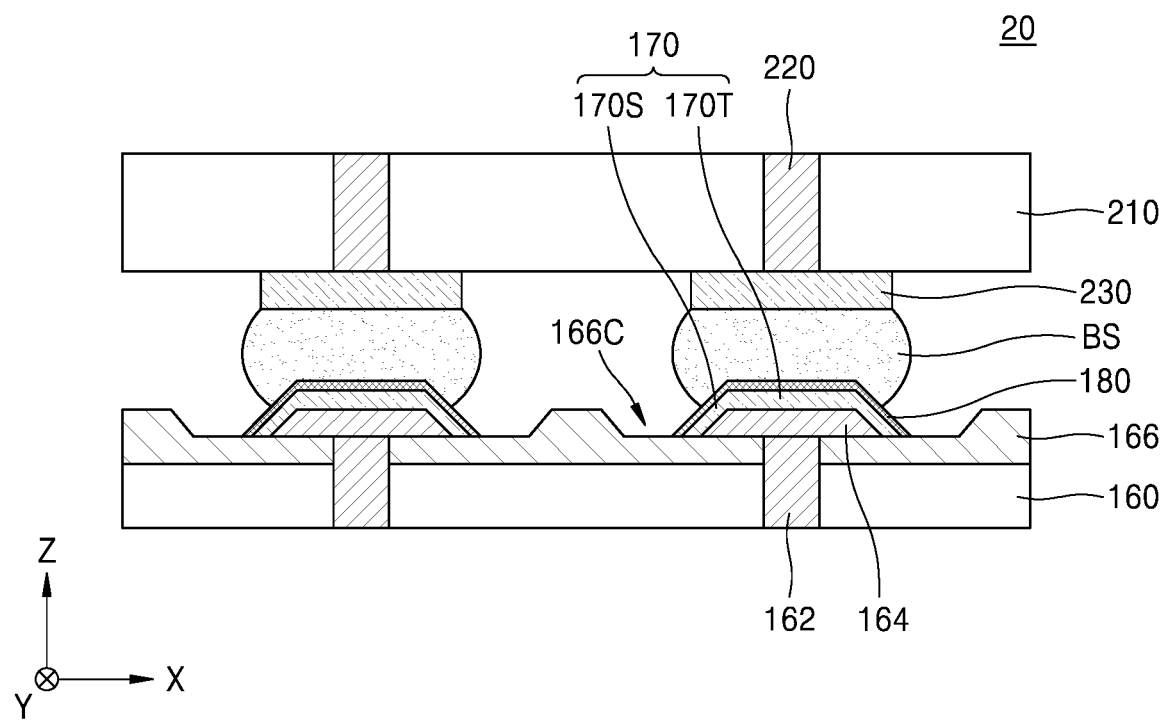
FIGS. 3 to 5 are enlarged cross-sectional views of a semiconductor package, according to example embodiments obtained by enlarging portion II of FIG. 1.
Figure 4:
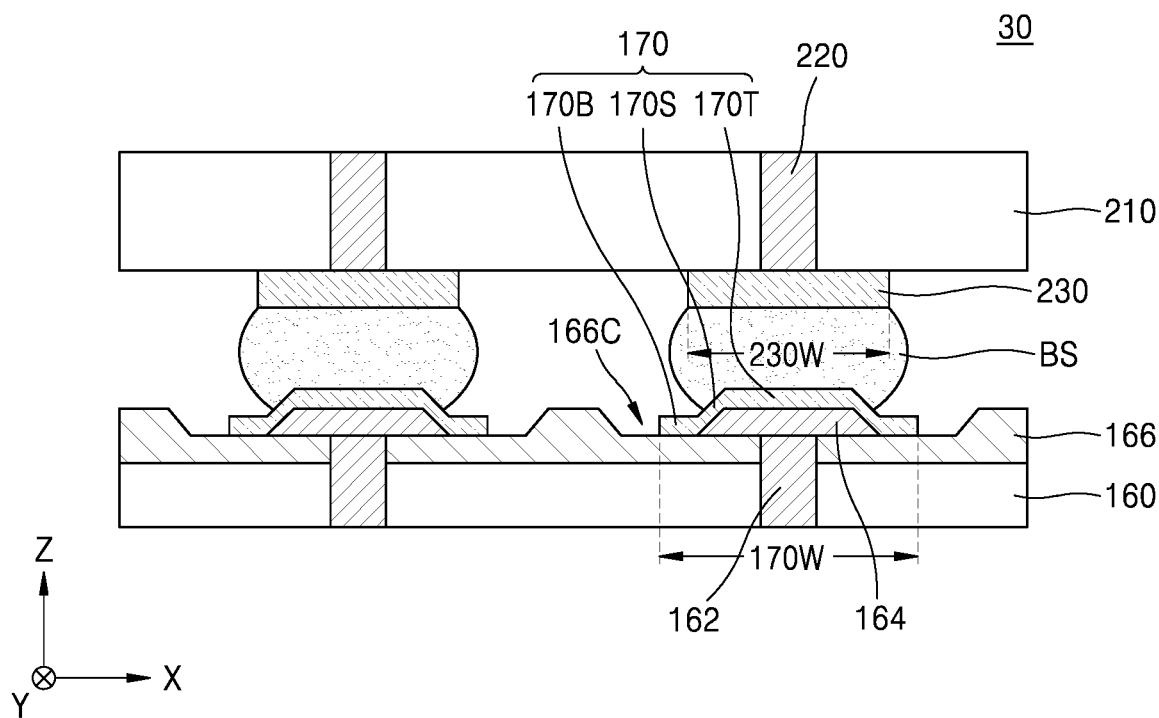
Figure 5:
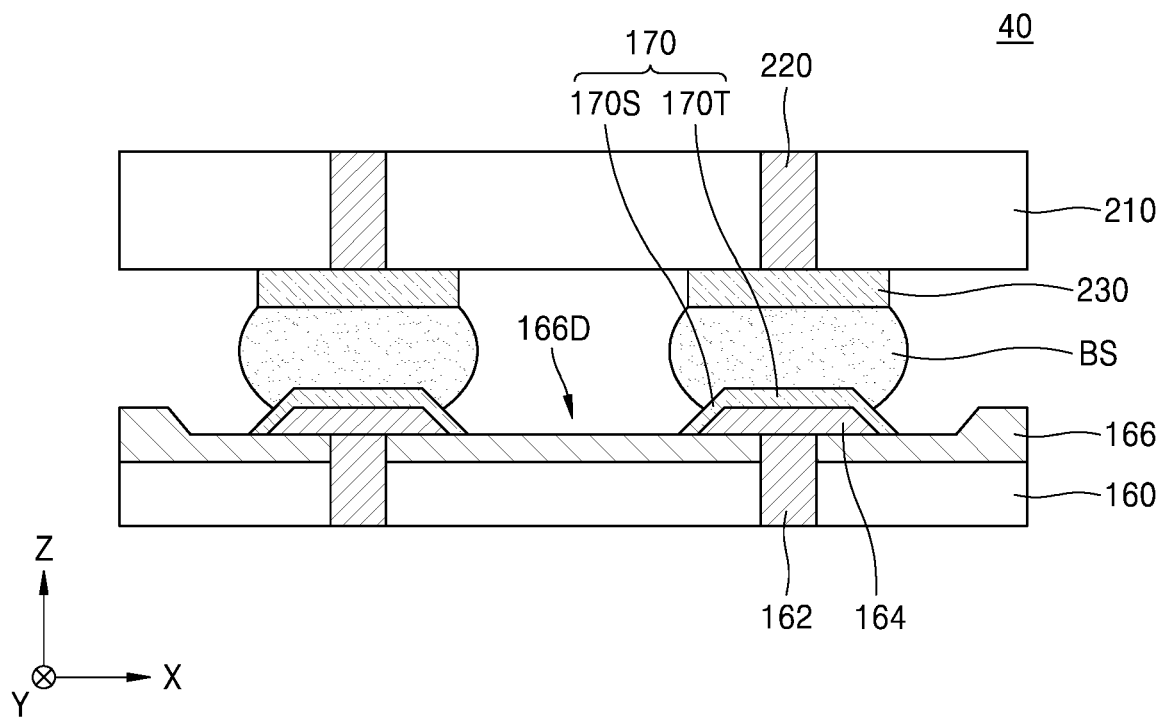

FIGS. 3 to 5 are enlarged cross-sectional views of a semiconductor package according to another embodiment by enlarging portion II of FIG. 1, respectively.

Most of components constituting semiconductor packages 20, 30, and 40 described later below and materials constituting the components are substantially the same as those described with respect to FIGS. 1 and 2. Therefore, for convenience of description, the description will focus on differences from the semiconductor package 10 described above.

Referring to FIG. 3, the semiconductor package 20 includes the first substrate 101 having the first electrode pad 164, the first protective layer 166, the first bump pad 170, and a wetting layer 180, the second substrate 201 having the second bump pad 230, and the bump structure BS connecting the first substrate 101 to the second substrate 201. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The semiconductor package 20 of the present embodiment may include the wetting layer 180 in contact with the first bump pad 170. The wetting layer 180 has excellent thermal fatigue resistance and improves solderability by increasing the fluidity of solder, thereby improving the wettability of solder. For example, the wetting layer 180 may improve adhesion between the first bump pad 170 and the bump structure BS.

The wetting layer 180 may include, for example, Au, but is not limited thereto. The wetting layer 180 may be conformally formed along the shape of the first bump pad 170. In some embodiments, a lowermost end of the wetting layer 180 may be formed to contact a bottom surface of the cavity 166C. In addition, the lowermost surface of the wetting layer 180 may be formed to be at the same level as the lowermost surface of the first bump pad 170 and the lower surface of the first electrode pad 164. For example, the lowermost surface of the wetting layer 180, the lowermost surface of the first bump pad 170, and the lower surface of the first electrode pad 164 may be coplanar.

Referring to FIG. 4, the semiconductor package 30 includes the first substrate 101 having the first electrode pad 164, the first protective layer 166, and the first bump pad 170, the second substrate 201 having the second bump pad 230, and the bump structure BS connecting the first substrate 101 to the second substrate 201.

In the semiconductor package 30 of the present embodiment, the first bump pad 170 may have the flat upper portion 170T, the inclined side portion 170S extending from the flat upper portion 170T, and a flat lower portion 170B connecting from the inclined side portion 170S. The flat upper portion 170T, the inclined side portion 170S, and the flat lower portion 170B may be in material continuity. For example, the flat upper portion 170T, the inclined side portion 170S, and the flat lower portion 170B may be formed at the same time and of the same material, without a break in the continuity of the material of which they are formed.

The first bump pad 170 may include the inclined side portion 170S arranged along a side surface of the first electrode pad 164 to conformally surround the first electrode pad 164. Meanwhile, the first bump pad 170 may include the flat lower portion 170B extending from the inclined side portion 170S so as to partially cover the bottom surface of the cavity 166C of the first protective layer 166. Accordingly, a horizontal width 170W of the first bump pad 170 may be greater than a horizontal width 230W of the second bump pad 230.

A lower surface of the flat lower portion 170B of the first bump pad 170 may be formed to be at the same level as the lower surface of the first electrode pad 164. For example, the lower surfaces of the flat lower portion 170B and the first electrode pad 164 may be coplanar. As described above, because the first bump pad 170 is formed along the shape of the first electrode pad 164 and the bottom surface of the cavity 166C, there is an effect of increasing a contact area with the bump structure BS.

Referring to FIG. 5, the semiconductor package 40 includes the first substrate 101 having the first electrode pad 164, the first protective layer 166, and the first bump pad 170, the second substrate 201 having the second bump pad 230, and the bump structure BS connecting the first substrate 101 to the second substrate 201.

In the semiconductor package 40 of the present embodiment, a plurality of first bump pads 170 may be arranged in one cavity 166D of the first protective layer 166. The cavity 166D may have a bottom surface that is substantially planar and parallel to the upper surface of the first substrate 101. The plurality of first bump pads 170 may be arranged on the bottom surface of the cavity 166D. That is, compared to the semiconductor packages 10, 20, and 30 described above, the cavity 166D may be formed to have a wider bottom surface.

For example, the flat cavity 166D may be formed between neighboring first bump pads 170 without a protrusion of the first trapezoidal protective layer 166 being arranged.

FIG. 5 illustrates that two first bump pads 170 are arranged in one cavity 166D, but the disclosure is not limited thereto. For example, three or more first bump pads 170 may be arranged in one cavity 166D.

Figure 6:
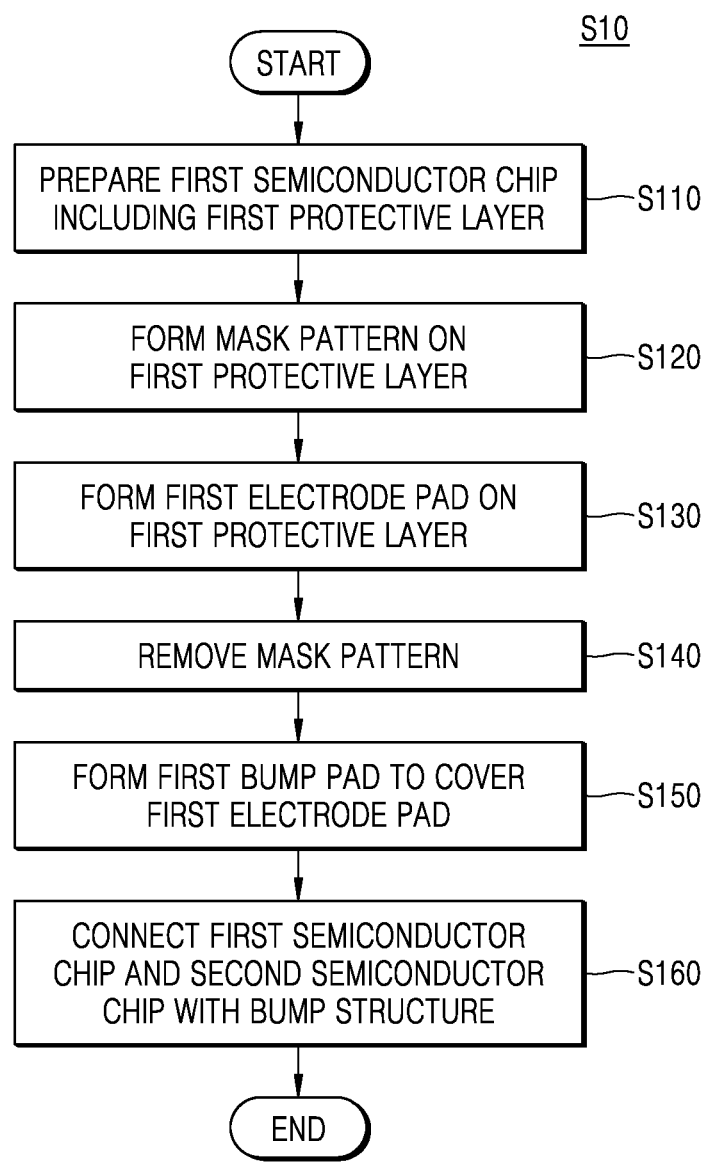
FIG. 6 is a flowchart illustrating a method of manufacturing a semiconductor package, according to an example embodiment of the inventive concept.

FIG. 6 is a flowchart illustrating a method of manufacturing a semiconductor package, according to an example embodiment of the inventive concept.

Referring to FIG. 6, a method of manufacturing a semiconductor package (operation S10) may include a process sequence including first to sixth operations S110 to S160.

When a certain embodiment may be implemented differently, a specific process order may be performed differently from the described order. For example, two consecutively described processes may be performed substantially at the same time or performed in an order opposite to the described order.

The method of manufacturing a semiconductor package according to the inventive concept (operation S10) may include preparing a first semiconductor chip including a first protective layer (S110), forming a mask pattern on the first protective layer (S120), forming a first electrode pad on the first protective layer (S130), removing a mask pattern (S140), forming a first bump pad to cover a first electrode pad (S150), and connecting the first semiconductor chip and the second semiconductor chip with a bump structure (S160).

Technical characteristics of each of the first to sixth operations S110 to S160 will be described in detail with reference to FIGS. 7 to 12 to be described later.

FIGS. 7 to 12 are cross-sectional views illustrating a method of manufacturing a semiconductor package, according to an example embodiment of the inventive concept, according to a process sequence.

Figure 7:
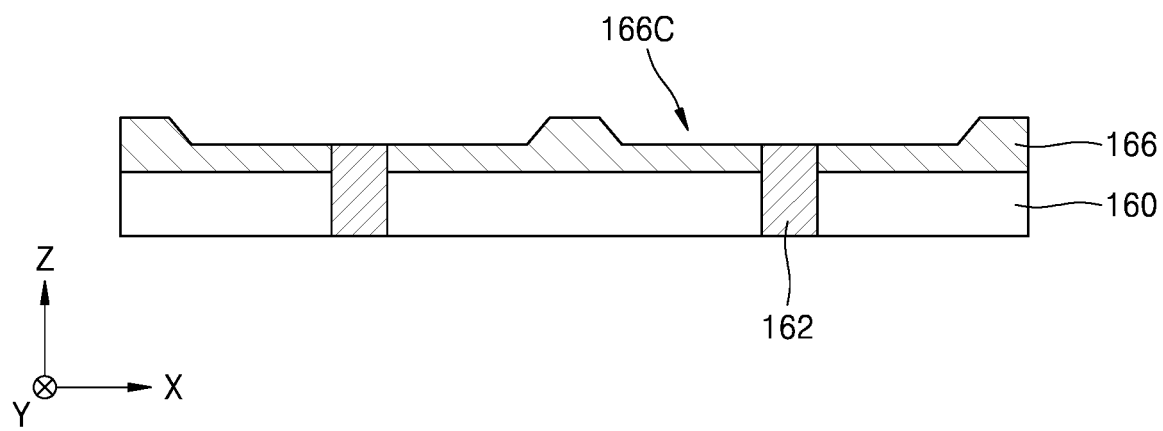
FIGS. 7 to 12 are cross-sectional views illustrating a method of manufacturing a semiconductor package, according to an example embodiment of the inventive concept, according to a process sequence.

Referring to FIGS. 1 and 7 together, the first semiconductor chip 100 including the first redistribution layer 160 capable of extending an integrated circuit function of the first semiconductor device layer 110 to the outside is prepared.

First, a plurality of first through electrodes 150 may be formed on the first substrate 101. In general, a method of forming the first through electrode 150 may be classified into a via first method, a via middle method, and a via last method. For example, in the via last method, after forming the first semiconductor device layer 110 and the first wiring layer 120 on the lower surface 101B of the first substrate 101, the first through electrode 150 penetrating the first substrate 101 from the upper surface 101T to the lower surface 101B may be formed.

Thereafter, the first redistribution layer 160 electrically connected to the first through electrode 150 may be formed. The first redistribution layer 160 may be formed on the upper surface 101T of the first substrate 101 and may be electrically connected to the first through electrode 150. Forming the first redistribution layer 160 may include forming the redistribution line 162 and the first protective layer 166 having the cavity 166C. The first protective layer 166 may be formed as a single layer or a multilayer insulating layer to insulate the redistribution line 162.

Figure 8:
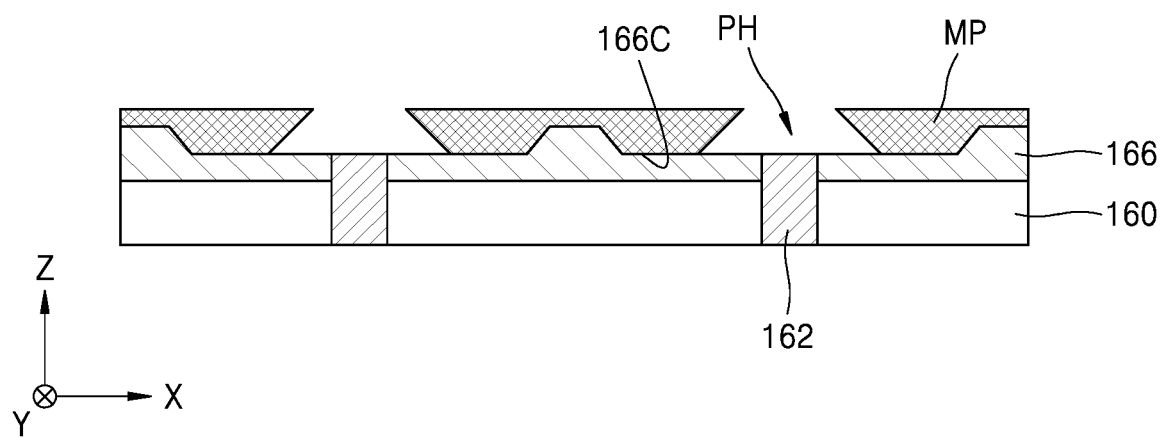

Referring to FIG. 8, a photoresist is coated on the first protective layer 166, and the photoresist is patterned by exposure and development to form a mask pattern MP.

First, the photoresist is formed by coating a negative photoresist solution to the entire surface of the first protective layer 166 to a certain thickness. The negative photoresist solution may be coated by a spin coating method.

Thereafter, the photoresist is patterned by exposure and development to form the mask pattern MP having a pattern hole PH. The pattern hole PH of the mask pattern MP formed of the negative photoresist solution may have a lower horizontal width greater than an upper horizontal width.

Figure 9:
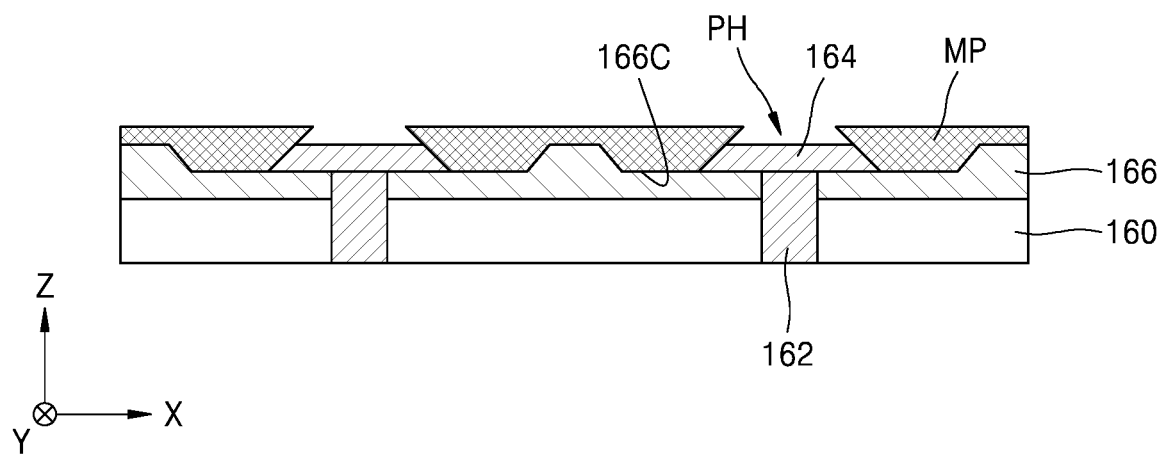

Referring to FIG. 9, the first electrode pad 164 is formed on the first protective layer 166 on which the mask pattern MP is formed.

The first electrode pad 164 may be formed to directly contact an end of the redistribution line 162 opened by the pattern hole PH of the mask pattern MP. The first electrode pad 164 may be formed by an electroplating process.

The first electrode pad 164 may include, for example, one of Cu, Ni, and Au or an alloy thereof, or a multilayer structure of a plurality of metals selected from among them.

The first electrode pad 164 may be formed so as not to completely fill the pattern hole PH of the mask pattern MP, but to fill only a portion of the pattern hole PH. For example, a thickness in a vertical direction (Z direction) of the first electrode pad 164 may be less than a thickness in a vertical direction (Z direction) of the mask pattern MP.

Figure 10:
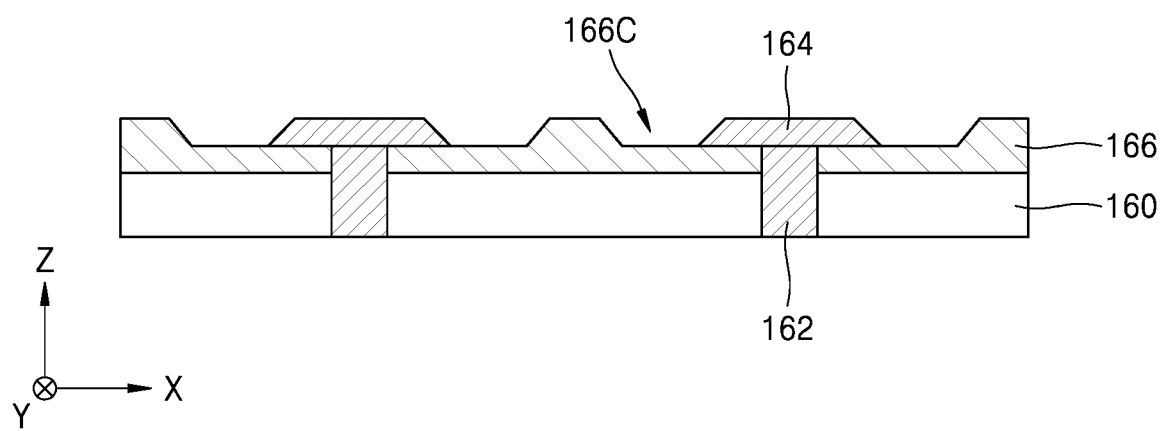

Referring to FIG. 10, after the first electrode pad 164 is formed, the mask pattern MP (see FIG. 9) is removed.

The mask pattern MP (see FIG. 9) may be completely removed using an ashing and stripping process. The removal process of the mask pattern MP (se FIG. 9) may be performed under conditions in which consumption of the first electrode pad 164 and the first protective layer 166 is maximally suppressed.

Figure 11:
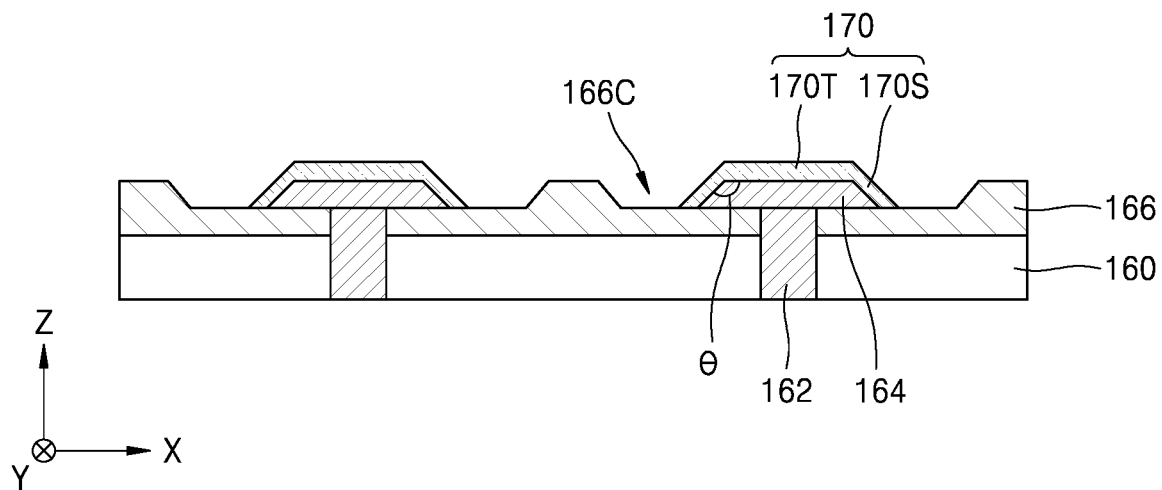

Referring to FIG. 11, the first bump pad 170 is formed to conformally cover the first electrode pad 164.

The first bump pad 170 may be formed to be electrically connected to the first electrode pad 164. The first bump pad 170 may be arranged in the cavity 166C of the first protective layer 166.

In more detail, the first electrode pad 164 has a trapezoidal shape, and the first bump pad 170 may have the flat upper portion 170T and the inclined side portion 170S extending from the flat upper portion 170T. For example, the first bump pad 170 may include the inclined side portion 170S arranged along the side surface of the first electrode pad 164 to conformally surround the first electrode pad 164. An angle θ formed by a point where the flat upper portion 170T and the inclined side portion 170S meet on the first bump pad 170 may be greater than about 90° and less than about 180°.

In some embodiments, a lowermost end of the first bump pad 170 may be formed to contact a bottom surface of the cavity 166C. Further, the lowermost end of the first bump pad 170 may be formed to be at the same level as a lower surface of the first electrode pad 164.

Figure 12:
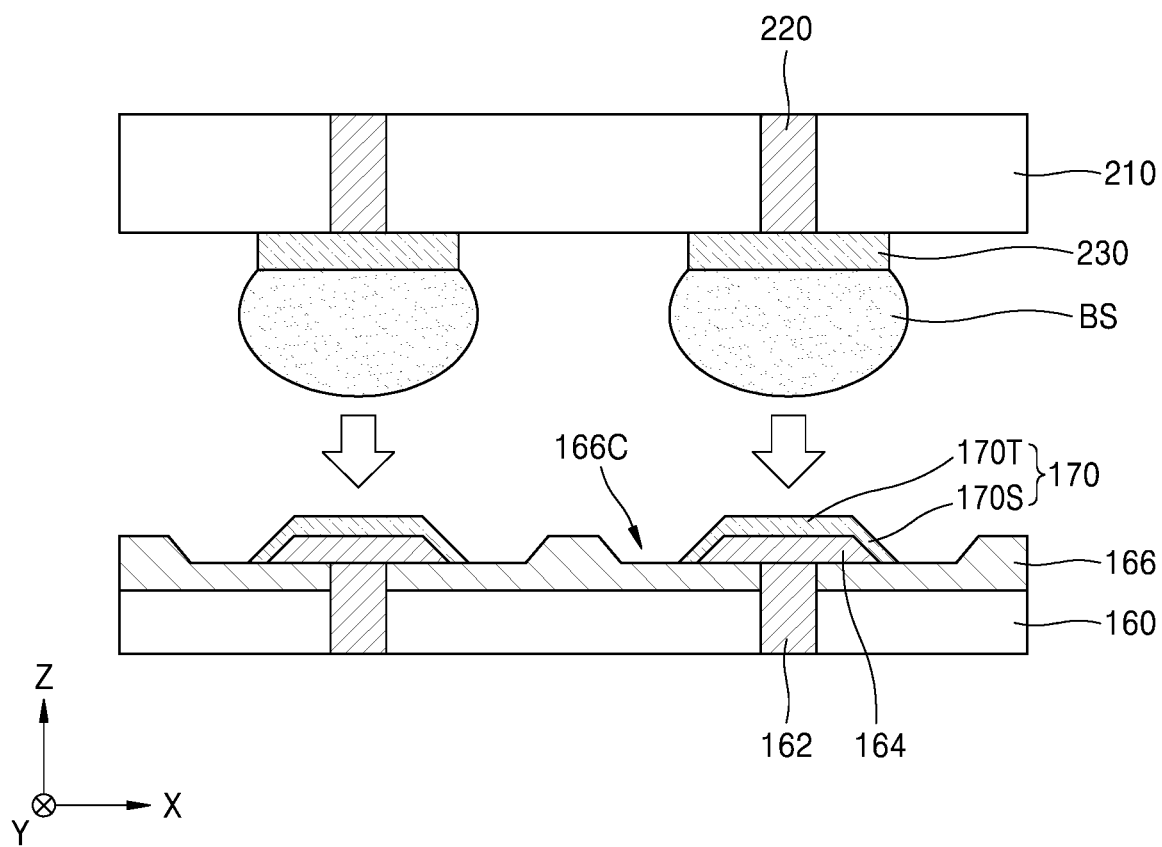

Referring to FIGS. 1 and 12 together, the lower surface 201B of the second substrate 201 to which the bump structure BS is previously attached is arranged to face the upper surface 101T of the first substrate 101.

By pressure applied to the second substrate 201, the second semiconductor chip 200 may be electrically connected to the first semiconductor chip 100 through the bump structure BS.

As a result, by arranging the first bump pad 170 having the inclined side portion 170S under the bump structure BS, the semiconductor package 10 according to the inventive concept may guide a protruding portion of the bump structure BS in a downward direction (Z direction) rather than in a side direction (X direction), that is, a direction of the first substrate 101, even under compression conditions such as overpressing and/or misalignment between the first and second substrates 101 and 201.

In this way, because the semiconductor package 10 according to the inventive concept may prevent a phenomenon in which protruding portions of neighboring bump structures BS are bonded to each other in advance, defects such as shorts may be suppressed as much as possible. Thus, electrical characteristics and reliability of the semiconductor package 10 may be improved.

Figure 13:
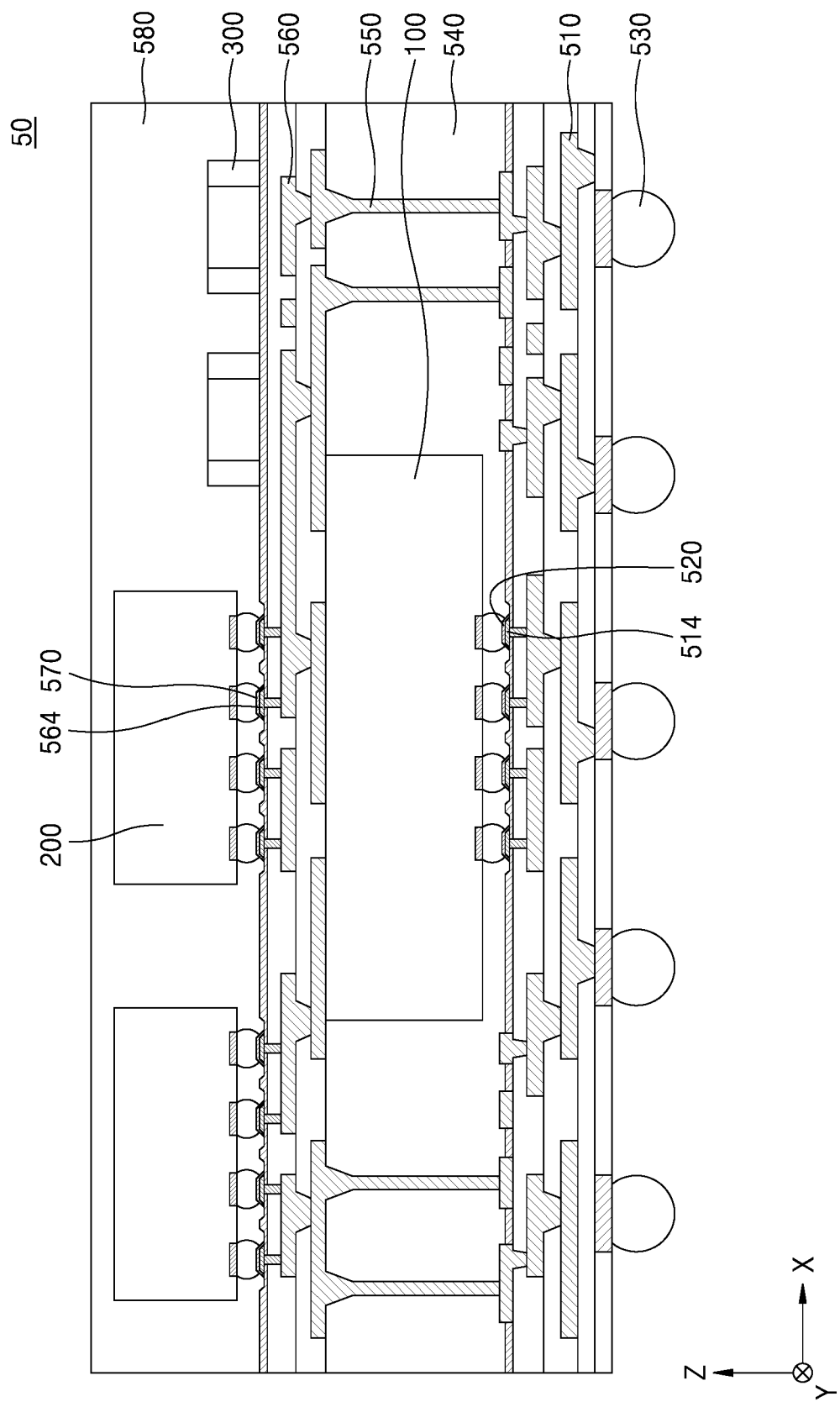
FIGS. 13 to 15 are cross-sectional views of a semiconductor package, according to example embodiments of the inventive concept.
Figure 14:
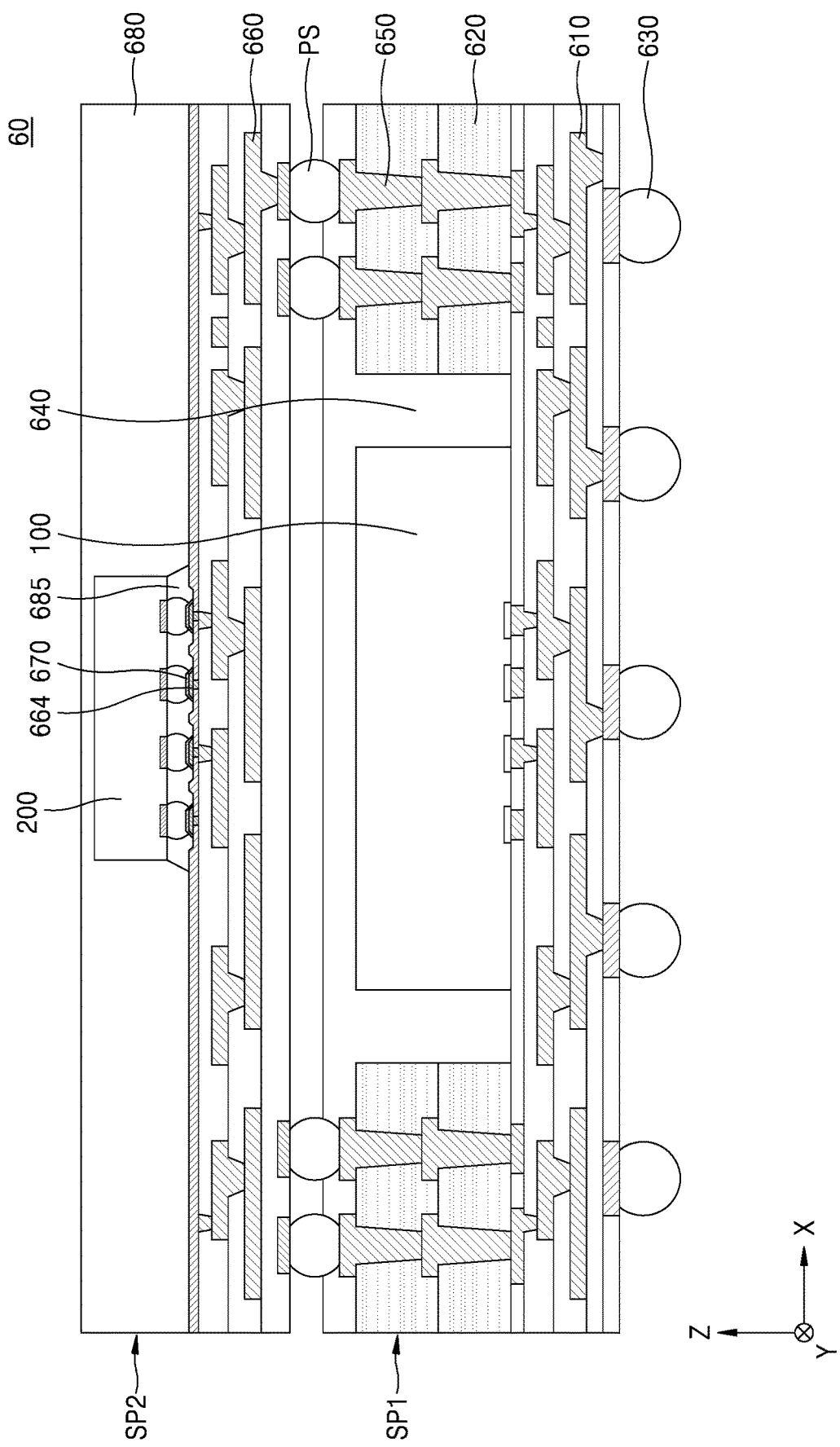
Figure 15:
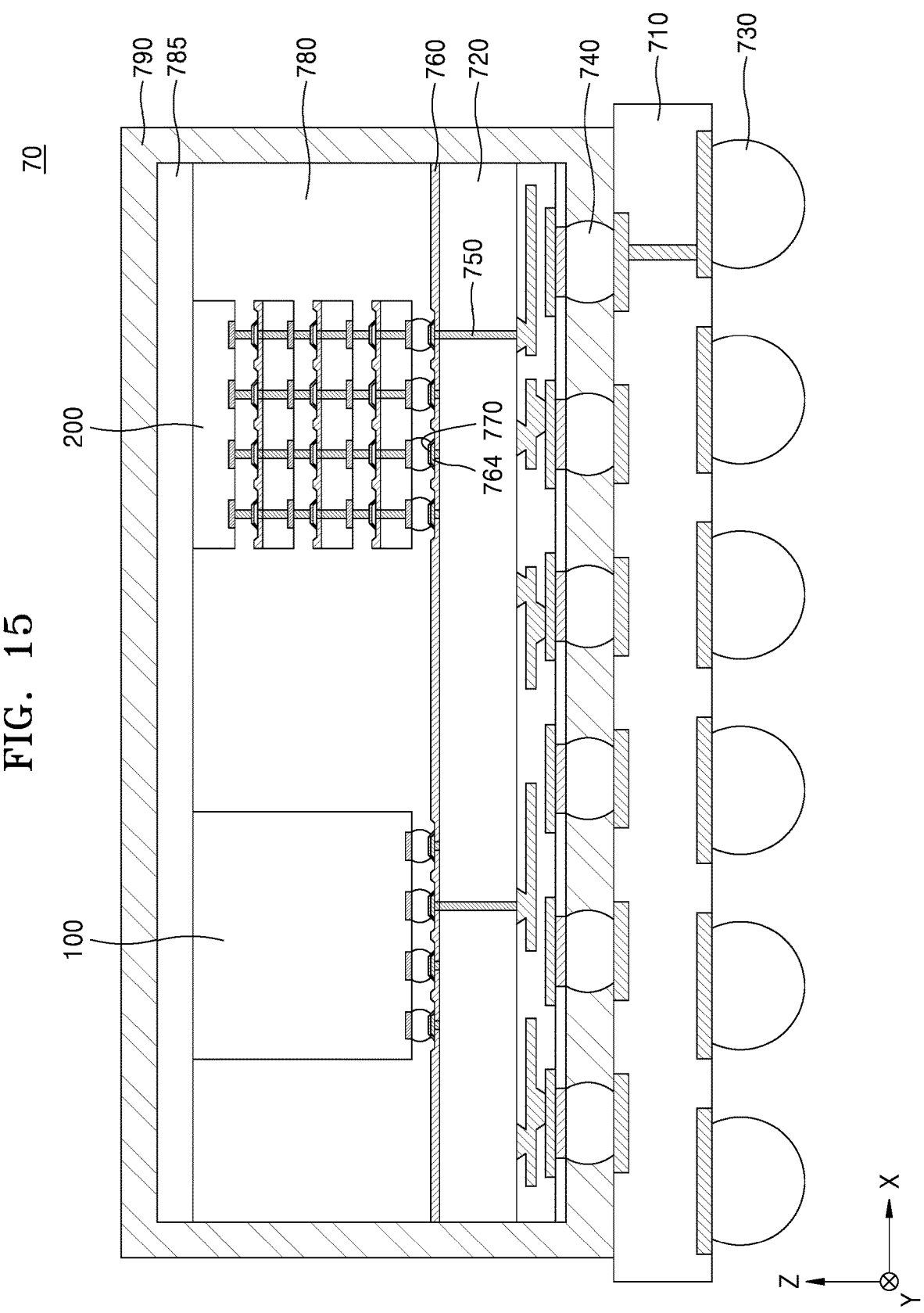

FIGS. 13 to 15 are cross-sectional views of a semiconductor package, according to example embodiments of the inventive concept.

Most of components constituting semiconductor packages 50, 60, and 70 described later below and materials constituting the components are substantially the same as those described with respect to FIGS. 1 and 2. Therefore, for convenience of description, the description will focus on differences from the semiconductor package 10 described above.

FIG. 13 shows the semiconductor package 50 including an upper redistribution layer 560 on an upper surface of the first semiconductor chip 100 and including the second semiconductor chip 200 and a passive device 300 on the upper redistribution layer 560.

The semiconductor package 50 of the present embodiment may include a lower redistribution layer 510 under the first semiconductor chip 100, and a first electrode pad 514 and a first bump pad 520 may be arranged on an upper surface of the lower redistribution layer 510. In addition, a connection terminal 530 may be connected under the lower redistribution layer 510.

The semiconductor package 50 according to the present embodiment may include a molding through electrode 550 penetrating a first molding member 540. Side surfaces of the first semiconductor chip 100 and the molding through electrode 550 may be covered by the first molding member 540 and upper surfaces of the first semiconductor chip 100 and the molding through electrode 550 may be exposed by the first molding member 540.

The semiconductor package 50 of the present embodiment may include the second semiconductor chip 200 and the passive device 300. The second semiconductor chip 200 and the passive device 300 may be mounted on the upper redistribution layer 560 after forming the upper redistribution layer 560 electrically connected to the molding through electrode 550. In some embodiments, a plurality of second semiconductor chips 200 and/or a plurality of passive devices 300 may be mounted on the upper redistribution layer 560. The second electrode pad 564 and the second bump pad 570 may be arranged on an upper surface of the upper redistribution layer 560. A second molding member 580 may be arranged to surround the second semiconductor chip 200 and the passive device 300.

In the semiconductor package 50 of the present embodiment, the first electrode pad 514 and the first bump pad 520, and the second electrode pad 564 and the second bump pad 570 may have substantially the same or similar characteristics to those described with respect to the semiconductor package 10 above. For example, the first electrode pad 514 and the second electrode pad 564 may be substantially the same as the first electrode pad 164, and the first bump pad 520 and the second bump pad 570 may be substantially the same as the first bump pad 170.

FIG. 14 shows the semiconductor package 60 including the second semiconductor chip 200 on the first semiconductor chip 100 in a sub-package form.

In the semiconductor package 60 of the present embodiment, a fan-out panel level package (FO-PLP) structure and a package on package (PoP) structure may be simultaneously applied. In other words, a first sub-package SP1 including the first semiconductor chip 100 and a second sub-package SP2 including the second semiconductor chip 200 may be connected with an inter-package connection structure PS to form one semiconductor package 60. For example, the first semiconductor chip 100 may be a controller semiconductor chip, and the second semiconductor chip 200 may be a memory semiconductor chip.

The first sub-package SP1 may include a frame structure 620 surrounding a side surface of the first semiconductor chip 100. The frame structure 620 is configured to support the semiconductor package 60, thereby maintaining rigidity and ensuring thickness uniformity. The frame structure 620 has an upper surface and a lower surface facing each other, and a through area is formed to penetrate between the upper surface and the lower surface. The first semiconductor chip 100 is arranged to be apart from the frame structure 620 in the through area, and as a result, the side surface of the first semiconductor chip 100 is surrounded by the frame structure 620.

The material of the frame structure 620 is not particularly limited as long as it can support the semiconductor package 60. For example, an insulating material, a metal having excellent rigidity and thermal conductivity, glass, ceramic, plastic, and the like may be used. A thickness of the frame structure 620 is not particularly limited, and may be designed according to a thickness of the first semiconductor chip 100.

The first sub-package SP1 may include the first semiconductor chip 100 and a first redistribution layer 610 under the first semiconductor chip 100. In addition, a connection terminal 630 may be connected under the first redistribution layer 610, and a first molding member 640 may be arranged to surround the first semiconductor chip 100. In addition, the frame structure 620 may include a frame through electrode 650 penetrating therein. The frame through electrode 650 may pass through a body of the frame structure 620. The frame through electrode 650 may be electrically connected to the inter-package connection structure PS.

The second sub-package SP2 may include the second semiconductor chip 200 and a second redistribution layer 660 under the second semiconductor chip 200, and an electrode pad 664 and a bump pad 670 may be arranged on an upper surface of the second redistribution layer 660. In addition, the second sub-package SP2 may include an underfill 685 for reinforcing connection between the second semiconductor chip 200 and a solder ball, and may further include a second molding member 680 that protects the second semiconductor chip 200 from external influences such as contamination and impact.

In the semiconductor package 60 of the present embodiment, the electrode pad 664 and the bump pad 670 may have substantially the same or similar characteristics to those described with respect to the semiconductor package 10 above. For example, the electrode pad 664 and the bump pad 670 may be substantially the same as the first electrode pad 164 and the first bump pad 170, respectively.

FIG. 15 shows the semiconductor package 70 including a package substrate 710, an interposer 720 on the package substrate 710, and the first semiconductor chip 100 and the second semiconductor chip 200 on the interposer 720.

The package substrate 710 included in the semiconductor package 70 of the present embodiment may be formed based on a printed circuit board, a wafer substrate, a ceramic substrate, a glass substrate, or the like.

A connection terminal 730 may be arranged on a lower surface of the package substrate 710. The semiconductor package 70 may be electrically connected to and mounted on a module substrate or a system board of an electronic product through the connection terminal 730.

The interposer 720 may include a solder bump 740 connected to a lower portion thereof, and may include a redistribution layer 760 arranged thereon. The solder bump 740 and the redistribution layer 760 may be electrically connected to each other through a through electrode 750. In addition, a first electrode pad 764 and a first bump pad 770 may be arranged on an upper surface of the redistribution layer 760.

In the semiconductor package 70 of the present embodiment, the first semiconductor chip 100 and the second semiconductor chip 200 may be mounted on the redistribution layer 760 of the interposer 720. In addition, a molding member 780 surrounding the first semiconductor chip 100 and the second semiconductor chip 200 and a heat-dissipating member 785 on the molding member 780 may be arranged. In some embodiments, the semiconductor package 70 may include the interposer 720, the molding member 780, and an encapsulation 790 surrounding the heat-dissipating member 785.

The first semiconductor chip 100 is a single logic chip and may be implemented as a microprocessor, a graphic processor, a signal processor, a network processor, a chipset, an audio codec, a video codec, an application processor, or a system-on-chip. The second semiconductor chip 200 may be a high bandwidth memory chip in which a plurality of slices form a stacked structure. The first electrode pad 764 and the first bump pad 770 may be arranged between the plurality of slices, respectively.

In the semiconductor package 70 of the present embodiment, the first electrode pad 764 and the first bump pad 770 may have substantially the same or similar characteristics to those described with respect to the semiconductor package 10 above. For example, the first electrode pad 764 and the first bump pad 770 may be substantially the same as the first electrode pad 164 and the first bump pad 170, respectively.

Figure 16:
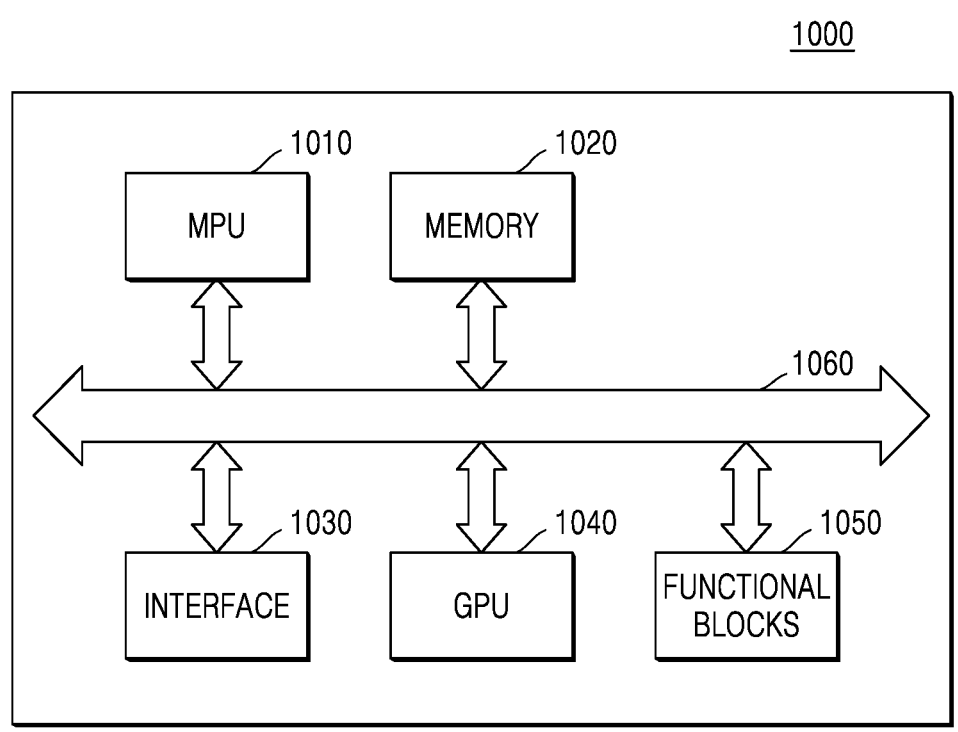
FIG. 16 is a configuration diagram of a semiconductor package, according to example embodiments.

FIG. 16 is a configuration diagram of a semiconductor package, according to example embodiments.

Referring to FIG. 16, a semiconductor package 1000 may include a micro processing unit (MPU) 1010, a memory 1020, an interface 1030, a graphics processing unit (GPU) 1040, functional blocks 1050, and a bus 1060 connecting them to each other. The semiconductor package 1000 may include both the micro processing unit 1010 and the graphics processing unit 1040, or may include only one of them.

The micro processing unit 1010 may include a core and a cache. For example, the micro processing unit 1010 may include multiple cores. Each of the multiple cores may have the same or different performance. In addition, each core of the multiple cores may be activated at the same time or at different times.

The memory 1020 may store a result of processing by the functional blocks 1050 under the control of the micro processing unit 1010. The interface 1030 may exchange information or signals with external devices. The graphics processing unit 1040 may perform graphics functions. For example, the graphics processing unit 1040 may perform a video codec or may process 3D graphics. The functional blocks 1050 may perform various functions. For example, when the semiconductor package 1000 is an application processor used in a mobile device, some of the functional blocks 1050 may perform a communication function.

The semiconductor package 1000 may include any one of the semiconductor packages 10, 20, 30, 40, 50, 60, and 70 described with respect to FIGS. 1 to 15 above.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a first substrate having a first electrode pad and a first protective layer in which a cavity is formed;
   a first bump pad arranged in the cavity and connected to the first electrode pad;
   a second substrate facing the first substrate and having a second bump pad;
   a bump structure in contact with the first bump pad and the second bump pad;
   a first through electrode penetrating the first substrate; and
   a second through electrode penetrating the second substrate,
   wherein a surface on which the first bump pad is formed is an inactive surface of the first substrate, and
   wherein a surface on which the second bump pad is formed is an active surface of the second substrate,
   wherein the first electrode pad has a trapezoidal shape,
   wherein the first bump pad has a flat upper portion and an inclined side portion extending along a side surface of the first electrode pad, and
   wherein a lowermost surface of the inclined side portion of the first bump pad and a lower surface of the first electrode pad are in contact with a top surface of the first protective layer in the cavity.

2. The semiconductor package of claim 1, wherein the first bump pad conformally surrounds the first electrode pad.

3. The semiconductor package of claim 1, wherein, in the first bump pad, an angle formed by the flat upper portion and the inclined side portion is greater than about 90° and less than about 180°.

4. The semiconductor package of claim 1, wherein the lowermost surface of the inclined side portion of the first bump pad is at the same level as the lower surface of the first electrode pad.

5. The semiconductor package of claim 1, wherein a lowermost end of the first bump pad extends along a bottom surface of the cavity.

6. The semiconductor package of claim 5, wherein a horizontal width of the first bump pad is greater than a horizontal width of the second bump pad.

7. The semiconductor package of claim 1,
   wherein an upper surface of the bump structure is flat along the second bump pad, and
   wherein a lower surface of the bump structure is at least partially inclined along the first bump pad.

8. The semiconductor package of claim 7, wherein the lower surface of the bump structure covers the flat upper portion and at least a portion of the inclined side portion of the first bump pad.

9. A semiconductor package comprising:
   a first substrate having a first surface, a first through electrode protruding toward the first surface, and a first protective layer having a cavity formed toward the first surface;
   a first bump pad arranged in the cavity and connected to the first through electrode;

a second substrate having a second surface facing the first surface and including a second through electrode protruding toward the second surface;

a second bump pad on the second surface and connected to the second through electrode; and a bump structure in contact with the first bump pad and the second bump pad, respectively, wherein the first bump pad has an upper portion and an inclined side portion extending from the upper portion, and an angle formed by the upper portion and the inclined side portion is greater than about 90° and less than about 180°.

10. The semiconductor package of claim 9, wherein a first trapezoidal electrode pad is arranged at an end of the first through electrode, and wherein the first bump pad covers both an upper surface and a side surface of the first trapezoidal electrode pad.

11. The semiconductor package of claim 9, wherein a level of a lowermost end of the first bump pad is the same as a level of a bottom surface of the cavity, and wherein a level of an uppermost end of the first bump pad is greater than a level of an upper surface of the cavity.

12. The semiconductor package of claim 9, wherein the first surface is an inactive surface of the first substrate, and wherein the second surface is an active surface of the second substrate.

13. The semiconductor package of claim 12, wherein the first substrate and the second substrate are arranged in a stacked structure to form a high bandwidth memory chip.

14. A semiconductor package comprising:

a first substrate having a redistribution layer formed on an inactive surface, a first trapezoidal electrode pad connected to the redistribution layer, and a first protective layer having a cavity;

a first bump pad arranged in the cavity and covering both upper and side surfaces of the first trapezoidal electrode pad;

a second substrate having a second bump pad on an active surface; and a bump structure in contact with the first bump pad and the second bump pad, wherein the first bump pad has a flat upper portion and an inclined side portion extending along a side surface of the first trapezoidal electrode pad, and an angle formed by the upper portion and the inclined side portion is greater than about 90° and less than about 180°.

15. The semiconductor package of claim 14, wherein the first trapezoidal electrode pad includes copper (Cu), wherein the first bump pad includes nickel (Ni), and wherein a wetting layer including gold (Au) is arranged between the first bump pad and the bump structure.

16. The semiconductor package of claim 14, wherein compressive stress of the bump structure is applied from the second bump pad toward the first bump pad.

17. The semiconductor package of claim 16, wherein a first area in which the bump structure contacts the first bump pad is greater than a second area in which the bump structure contacts the second bump pad.

18. The semiconductor package of claim 14, wherein a lower surface of the first trapezoidal electrode pad is in contact with the first protective layer, and wherein the first bump pad is in contact with both the first trapezoidal electrode pad and the first protective layer.

* * * * *